(12) United States Patent
Forthaus

(10) Patent No.: US 10,605,624 B2
(45) Date of Patent: Mar. 31, 2020

(54) MAGNET-BASED ANGULAR DISPLACEMENT MEASURING SYSTEM

(71) Applicant: FRABA B.V., SG Heerlen (NL)

(72) Inventor: Martin Forthaus, Cologne (DE)

(73) Assignee: FRABA B.V., SG Heerlen (NL)

( * ) Notice: Subject to any disclaimer, the term of this patent is extended or adjusted under 35 U.S.C. 154(b) by 246 days.

(21) Appl. No.: 15/546,009

(22) PCT Filed: Dec. 9, 2015

(86) PCT No.: PCT/EP2015/079132
§ 371 (c)(1),
(2) Date: Jul. 25, 2017

(87) PCT Pub. No.: WO2016/119963
PCT Pub. Date: Aug. 4, 2016

(65) Prior Publication Data
US 2018/0010927 A1 Jan. 11, 2018

(30) Foreign Application Priority Data

Jan. 28, 2015 (DE) .................. 10 2015 101 246

(51) Int. Cl.
  *G01R 33/00* (2006.01)
  *G01R 33/038* (2006.01)
  *G01D 5/14* (2006.01)
  *H02K 11/215* (2016.01)

(52) U.S. Cl.
  CPC ......... *G01D 5/145* (2013.01); *G01R 33/0017* (2013.01); *G01R 33/0076* (2013.01); *G01R 33/038* (2013.01); *H02K 11/215* (2016.01)

(58) Field of Classification Search
  CPC ............ G01D 5/145; G01D 5/14; G01D 5/12; G01D 11/245; G01D 5/2451
  USPC ......................................... 324/207.25, 207.2
  See application file for complete search history.

(56) References Cited

U.S. PATENT DOCUMENTS

| | | |
|---|---|---|
| 4,409,579 A | 10/1983 | Chem |
| 6,483,296 B1 | 11/2002 | Hamaoka et al. |
| 7,368,840 B2 | 5/2008 | Terauchi et al. |
| 2001/0015642 A1 | 8/2001 | Fischer et al. |
| 2009/0072816 A1* | 3/2009 | Schrubbe ................. G01D 5/06 324/207.2 |
| 2009/0072819 A1* | 3/2009 | Takahashi .............. G01D 5/145 324/207.25 |
| 2010/0052663 A1 | 3/2010 | Mehnert et al. |

(Continued)

FOREIGN PATENT DOCUMENTS

| | | |
|---|---|---|
| CN | 102209883 A | 10/2011 |
| DE | 33 24 872 A1 | 1/1984 |

(Continued)

*Primary Examiner* — Christopher P McAndrew
(74) *Attorney, Agent, or Firm* — Norman B. Thot

(57) ABSTRACT

A magnet-based angular displacement measuring system for detecting a rotational movement of a driveshaft. The magnet-based angular displacement measuring system includes the driveshaft which includes an axial first shaft end region. The axial first shaft end region includes a magnetically non-conductive material. An exciter unit is rotationally coupled to the axial first shaft end region of the driveshaft. A stationary sensor unit functionally cooperates with the exciter unit to detect a rotational movement of the driveshaft.

15 Claims, 4 Drawing Sheets

(56) References Cited

U.S. PATENT DOCUMENTS

| | | | | |
|---|---|---|---|---|
| 2010/0109491 A1* | 5/2010 | Miyazaki | ............... | G01B 7/30 |
| | | | | 310/68 B |
| 2010/0321006 A1* | 12/2010 | Suzuki | ............... | G01D 5/145 |
| | | | | 324/207.25 |
| 2011/0080162 A1* | 4/2011 | Steinich | ............... | G01B 7/30 |
| | | | | 324/207.25 |
| 2011/0127997 A1 | 6/2011 | Itomi | | |
| 2011/0227563 A1* | 9/2011 | Akahane | ............... | G01D 5/145 |
| | | | | 324/207.25 |
| 2011/0260718 A1* | 10/2011 | Hirning | ............... | G01D 11/16 |
| | | | | 324/207.25 |
| 2013/0241538 A1 | 9/2013 | Akabane | | |

FOREIGN PATENT DOCUMENTS

| | | |
|---|---|---|
| DE | 38 13 610 A1 | 11/1989 |
| DE | 100 10 700 C1 | 9/2001 |
| DE | 10 2007 034 099 A1 | 1/2009 |
| DE | 10 2008 051 479 A1 | 3/2010 |
| DE | 10 2009 004 780 A1 | 7/2010 |
| DE | 11 2008 002 341 T5 | 7/2010 |
| DE | 10 2009 051 978 A1 | 5/2011 |
| DE | 10 2009 051 979 A1 | 6/2011 |
| DE | 10 2012 206 898 A1 | 10/2013 |
| DE | 10 2013 103 445 A1 | 10/2014 |
| DE | 10 2013 217 428 A1 | 11/2014 |
| EP | 1 061 341 A2 | 12/2000 |
| EP | 1 128 159 A2 | 8/2001 |
| EP | 2 159 547 A2 | 3/2010 |
| EP | 2 432 103 A2 | 3/2012 |
| JP | 06249607 A | 9/1994 |
| JP | 09243401 A | 9/1997 |
| JP | 11-23213 A | 1/1999 |
| JP | 2005168249 A | 6/2005 |

* cited by examiner

MAGNET-BASED ANGULAR DISPLACEMENT MEASURING SYSTEM

CROSS REFERENCE TO PRIOR APPLICATIONS

This application is a U.S. National Phase application under 35 U.S.C. § 371 of International Application No. PCT/EP2015/079132, filed on Dec. 9, 2015 and which claims benefit to German Patent Application No. 10 2015 101 246.4, filed on Jan. 28, 2015. The International Application was published in German on Aug. 4, 2016 as WO 2016/119963 A1 under PCT Article 21(2).

FIELD

The present invention relates to a magnet-based angular displacement measuring system for detecting a rotational movement of a drive shaft, comprising a drive shaft with an axial first shaft end region, an exciter unit coupled to the drive shaft at the first shaft end region for rotation therewith, and a stationary sensor unit which functionally cooperates with the exciter unit for detecting the rotational movement of the drive shaft.

BACKGROUND

Angular displacement measuring systems serve to measure rotational movements of a shaft and are often also referred to as angle measuring means, angular displacement sensors, or rotary encoders. They are in particular used to control and monitor machines and vehicles. Contactless angular displacement measuring systems, for example, electrically or magnetically induced systems, here play a special role since they have a long service life due to the wear-free sensor system. With magnet-based angular displacement systems, in particular with multi-turn absolute value encoders, a rotation of a shaft is inductively detected by a measuring unit, the measuring unit in particular comprising a rotating exciter unit, such as a permanent magnet, and a stationary sensor unit with at least one sensor, such as, for example, a Hall and/or a Wiegand sensor. The measuring unit is thereby mostly arranged at the free end of the shaft to be monitored.

Slight measuring errors frequently occur, however, when arranging or mounting a magnet based angular displacement measuring system directly on a drive shaft, in particular on a drive shaft of an electric motor/generator or a magnetic brake. Such measuring errors are most often caused by interferences acting on the angular displacement measuring system from outside. Examples of such interference include a magnetic field caused the drive shaft being magnetized in use by the electric motor or by an electromagnetic brake, and the magnetic field being transferred via the shaft which is typically made of steel so that, at the angular displacement measuring system, the rotational magnetic field formed by the exciter unit eventually changes, thereby causing measuring errors in the sensor unit. It is therefore necessary to avoid such interferences in the angular displacement measuring system in order to improve measuring accuracy.

DE 38 13 610 A1 describes an angle measuring means with a scanning means, wherein the scanning means is shielded from electric disturbing influences. The scanning means is thereby fastened in a housing in an electrically insulated manner and is connected to the mass potential of an evaluation unit. The housing is also in electric contact with the drive unit so that the interference signals outputted by the drive unit do not negatively affect the measuring values.

A drawback is, however, that magnetically induced interferences are not shielded off and measuring errors are still caused in the sensor unit, in particular with a magnet-based angle measuring means. The means for shielding the angle measuring means also has a very complex structure and comprises a great number of components.

SUMMARY

An aspect of the present invention is to provide an angular displacement measuring system for detecting a rotational movement of a drive shaft that provides for an exact and interference-free measuring, which has a simple structure, and which is simple to assemble.

In an embodiment, the present invention provides a magnet-based angular displacement measuring system for detecting a rotational movement of a drive shaft. The magnet-based angular displacement measuring system includes the drive shaft which comprises an axial first shaft end region. The axial first shaft end region comprises a magnetically non-conductive material. An exciter unit is rotationally coupled to the axial first shaft end region of the drive shaft. A stationary sensor unit is configured to functionally cooperate with the exciter unit to detect a rotational movement of the drive shaft.

BRIEF DESCRIPTION OF THE DRAWINGS

The present invention is described in greater detail below on the basis of embodiments and of the drawings in which.

DETAILED DESCRIPTION

Figure 1:
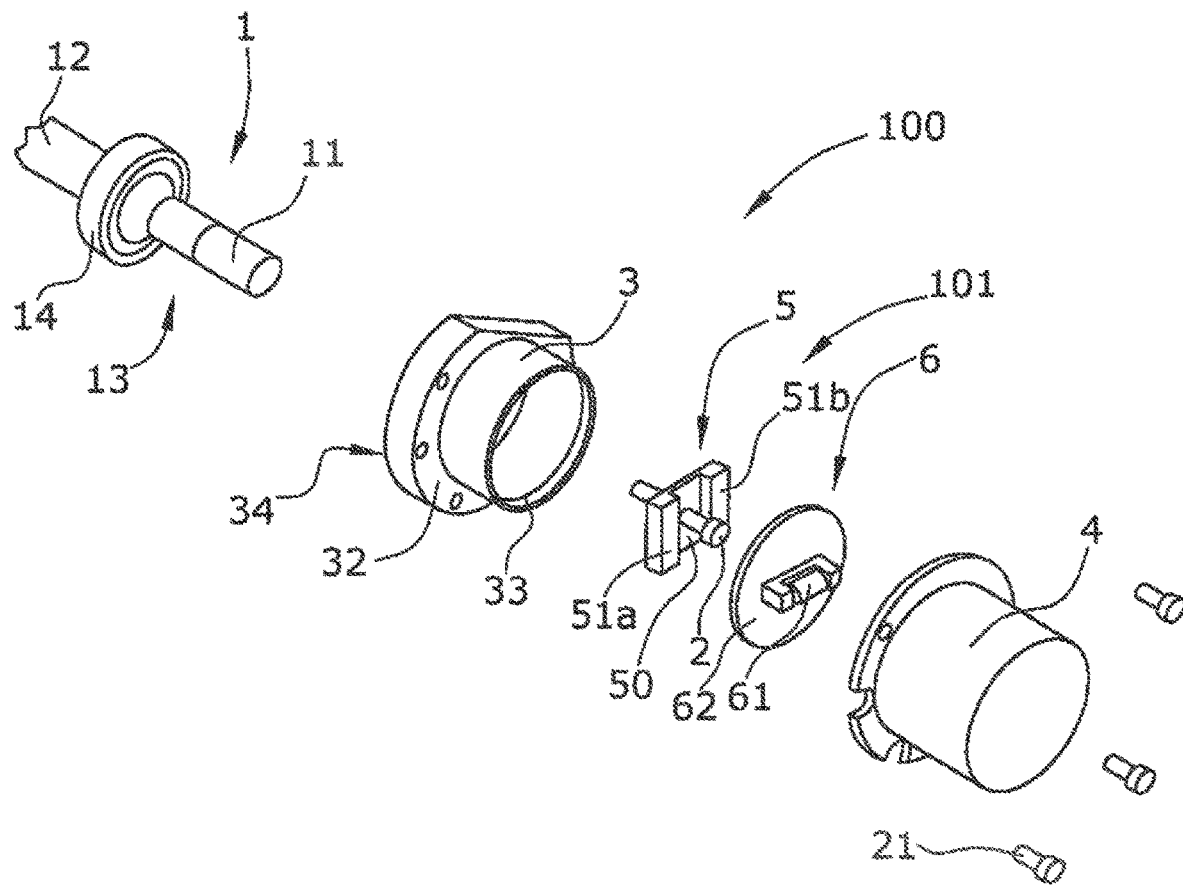
FIG. 1 schematically shows a perspective view of a first embodiment of an angular displacement measuring system according to the present invention, wherein the components are shown in an exploded view.

According to the present invention, at least the first shaft end region is made of a magnetically non-conductive or only a slightly conductive material, for example, of brass or titanium. The drive shaft may at least partly be formed as a solid shaft and may have different magnetic conductivities along its axial length. The drive shaft may, for example, not be magnetically conductive in the axial first shaft end region facing the measuring unit and may be magnetically conductive in an opposite second shaft end region averted from the measuring unit. Providing the magnetically not or only slightly conductive material in the first shaft end region makes it possible to prevent the transmission of a magnetic field induced in the drive shaft at least in the region of the free end at which the measuring unit is arranged. It is in particular possible to prevent the transmission of a magnetic interference in the axial direction through the drive shaft. The measuring unit can thereby be magnetically shielded. A magnetic field induced in the drive shaft can further already be concentrated and dissipated in the drive shaft at a defined axial distance from the measuring unit that corresponds to the axial length of the first shaft end region. It may in particular be possible to use a shielding body to dissipate a magnetic field generated in the drive shaft in a radially outward direction. The drive shaft can thereby be almost completely magnetically insulated in the first shaft end region so that this portion is particularly suited for coupling the measuring unit to the drive shaft.

The drive shaft may generally be an integrally formed shaft. In an embodiment, the drive shaft can, for example, be of a two-part or a multi-part design so that the drive shaft is made up from a plurality of separately formed shaft parts along its axial length. It is relatively simple for the drive shaft to thereby have different conductivities along its axial length. In particular in an axial portion facing the measuring unit, the drive shaft may have a lower magnetic and/or electric conductivity than in an axial portion averted from the measuring unit. For connecting the individual shaft parts, the individual shaft parts may interlock and/or be fixed to each other using auxiliary means.

In an embodiment of the present invention, the drive shaft can, for example, comprise a separately formed first shaft part and a separately formed second shaft part. The first shaft end region can, for example, here be formed by the first shaft part so that the first shaft part has no or only little magnetic conductivity. The first shaft part can, for example, be made of brass for this purpose. In contrast thereto, the second shaft part may be magnetically conductive and can, for example, be made of steel. The second shaft part may thus be a relatively low-cost, typical standard shaft of a drive train.

The individual shaft parts may be connected with each other in the axial direction. The first shaft part and the second shaft part may at least partly overlap radially to provide a particularly strong and kink-proof connection of the two shaft parts. The first shaft part may in particular comprise an axially protruding pin or coupling section that is at least partly surrounded radially by the second shaft part or which can be pushed axially into a corresponding recess in the second shaft part. This provides an increased stability of the connection and, at least in parts, for an axial and radial magnetic shielding of the first shaft part. The second shaft part may also have an axially protruding pin inserted into a corresponding recess in the first shaft part.

In an embodiment of the present invention, the first shaft part and the second shaft part can, for example, be connected for rotation with each other. The two shaft parts can, for example, be fixed or fastened to each other by friction welding. The rotational movement of the second shaft part may thereby be transmitted directly to the first shaft part so that an exact measurement of the rotational movement of the drive shaft is made possible. The first shaft part and the second shaft part can thus in particular be connected by material bonding, for example, by frictional welding, at the opposing axial end faces of the shaft parts. The first shaft part and the second shaft part may alternatively or additionally be connected in a form-fitting manner, for example, by a plug-in connection, in which the shaft parts may overlap each other at least partly in the radial direction and are secured, for example, by a radially inserted grub screw. The first shaft part and the second shaft part may also be connected with each other in a non-positive manner, for example, by a wedge-type or screw connection. A combination of the above connections is also possible. A particularly strong and compact structure of the angular displacement measuring system can thus be achieved.

In an embodiment of the present invention, the first shaft end region can, for example, be formed by a fastening device, in particular by a magnetically non-conductive screw. The fastening device can, for example, be made of titanium or brass to prevent a transmission of the magnetic field induced in the drive shaft or a shaft section to the exciter unit via the fastening device. The fastening device may serve to couple the exciter unit to the drive shaft or to fasten it to the drive shaft. The fastening device is advantageously arranged at the front end of the drive shaft facing the measuring unit therefor. A spacer or a spacer sleeve may additionally be provided at the axial end of the drive shaft between the exciter unit and the drive shaft to fix the exciter unit to the drive shaft and to avoid an undesirable transmission of magnetic interferences from the drive shaft towards the exciter unit, the spacer or spacer sleeve being made of a magnetically non-conductive material. The fastening device may in particular be connected with the drive shaft in a manner fixed for rotation. For arranging the fastening device which is formed, for example, as an axial screw, a bore may be formed in the drive shaft, the bore being, for example, coaxial to the drive shaft and having a thread corresponding to the screw. The exciter unit can thereby be mounted to the free end of the drive shaft in a relatively simple manner. It may additionally or alternatively be provided to adhesively bond the exciter unit to the drive shaft. The angular displacement measuring system can thereby be provided to be particularly compact and economic.

In an embodiment of the present invention, a shielding body having an axial cylindrical section that radially surrounds the drive shaft at least in an axial section can, for example, be provided, a defined air gap being formed between the shielding body and the drive shaft. The drive shaft may be made to be magnetically conductive, for example, of steel, at least in a partial region of this axial section, in particular in the second shaft part. The shielding body can, for example, be made of a particularly magnetically conductive material in order to effectively dissipate a magnetic field present in the drive shaft. The radial distance between the drive shaft and the shielding body may be constant along the axial length. It is thus possible to effect a large-surface and uniform transfer of a magnetic field from the drive shaft towards the shielding body. During assembly, the shielding body can also be sleeved over the drive shaft in a relatively simple manner. The shielding body may be configured to be stationary and in particular as an outer housing of at least the measuring unit. A magnetic field generated in the rotating components of the angular displacement measuring system can thereby be transferred to at least one stationary component, especially the shielding body, at a transfer location. The surface for shielding can thereby be enlarged without requiring additional rotating components and a resulting additional weight at the drive shaft. An effective shielding from an externally generated magnetic field can also be provided.

The shielding body may at least comprise an axial bearing section on which a bearing of the drive shaft abuts. The shielding body can, for example, comprise a shoulder on which a shaft bearing of the drive shaft abuts. An exact alignment of the angular displacement measuring system of the measuring unit is thereby possible with respect to the drive shaft, as well as a space-saving structure.

The shielding body can, for example, comprise at least one shoulder to which the sensor unit and/or a housing are fastened. The shielding body can, for example, be formed with a flange having a screw hole pattern to which flange the housing with a corresponding counter-flange and a corresponding screw hole pattern is fastened using screws. The shielding body may itself be adapted, for example, to be fixed to a machine via this or via a further shoulder. The shielding body may also be provided with a shoulder or a web for fastening the sensor unit. The shielding body in particular has a shoulder at which a sensor body can be inserted and fastened. It is thereby possible to align the components of the angular displacement measuring system with each other so that an air gap formed between rotating and stationary components can be relatively small while the angular displacement measuring system may have a relatively compact structure.

In an embodiment of the present invention, a housing can, for example, be provided which at least partly surrounds the angular displacement measuring system. The measuring unit and the shielding body may in particular be surrounded axially and/or radially by the housing. The housing can, for example, be made of steel. A particularly effective shielding of the measuring unit or of the angular displacement measuring system from interferences can thus be achieved that occur on the outside of the angular displacement measuring system and which could have negative effects on the angular displacement measuring system.

The housing can, for example, be adapted to be set axially on the shielding body. The housing can, for example, be designed as a pot adapted to be axially set on the angular displacement measuring system, in particular on the measuring unit. An effective shielding and a relatively simple assembly of the angular displacement measuring system are thereby possible.

The exciter unit may comprise a magnet carrier with at least one magnet fixed on the magnet carrier. The magnet carrier is provided in particular if two separately formed magnets are arranged. This provides for a relatively simple and economic manufacture and assembly of the exciter unit. The magnet carrier can be a flat disc which is not, for example, magnetically conductive. A double shielding can thereby be effected that exactly defines a magnetic field system so that the magnetic conditions at the sensor, in particular a Wiegand sensor, are secured and a multi-turn functionality of the sensor becomes possible.

In an embodiment of the present invention, the exciter unit can, for example, be formed by a magnet or a magnet body. The magnet body may be in the shape of a diametrically magnetized round magnet. A separately formed magnet carrier can thus be omitted and the angular displacement measuring system can have a very compact structure.

The exciter unit, in particular the magnet carrier or the magnet body itself, may be fastened by adhesive bonding directly to the first shaft end region of the drive shaft. The exciter unit may be adhesively bonded to the axial end face of the drive shaft. In this embodiment, the first shaft end region can, for example, be formed by a magnetically non-conductive shaft part. The angular displacement measuring system can have a very compact structure due to the adhesive bonding connection of the exciter unit directly to the drive shaft.

A recess may be provided at the first shaft end region of the drive shaft to increase the strength of the connection of the exciter unit and the drive shaft and/or to provide that the exciter unit is secure against rotation relative to the drive shaft, into which recess the exciter unit, in particular the magnet body or the magnet, can be set at least in part. The first shaft end region of the drive shaft may alternatively be provided with an outer contour onto which the exciter unit may be set at least in part. The recess or the outer contour may be formed coaxially and cylindrically or angularly on the drive shaft. The recess or the outer contour serves in particular to increase the surface area of the surfaces for adhesive bonding. With an angularly shaped recess or outer contour into which the exciter unit is inserted or onto which it is set using a corresponding angularly shaped part, it is possible, via a form-fitting engagement, to secure the exciter unit against rotation with respect to the drive shaft.

The present invention will be described in detail below under reference to three embodiments and to the accompanying drawings.

Figure 2:
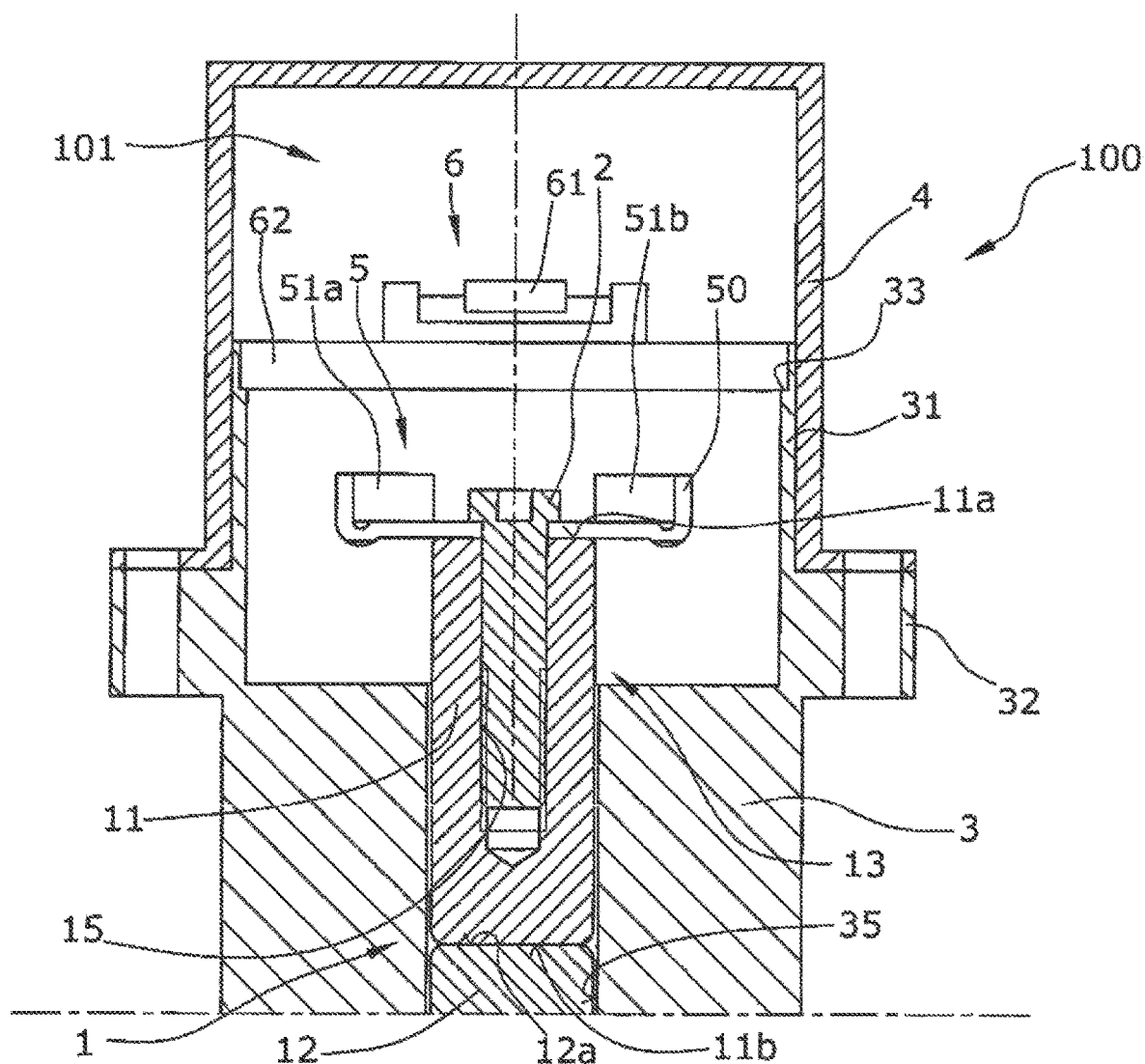
FIG. 2 schematically shows a detail of the first embodiment in a sectional side view.
Figure 3:
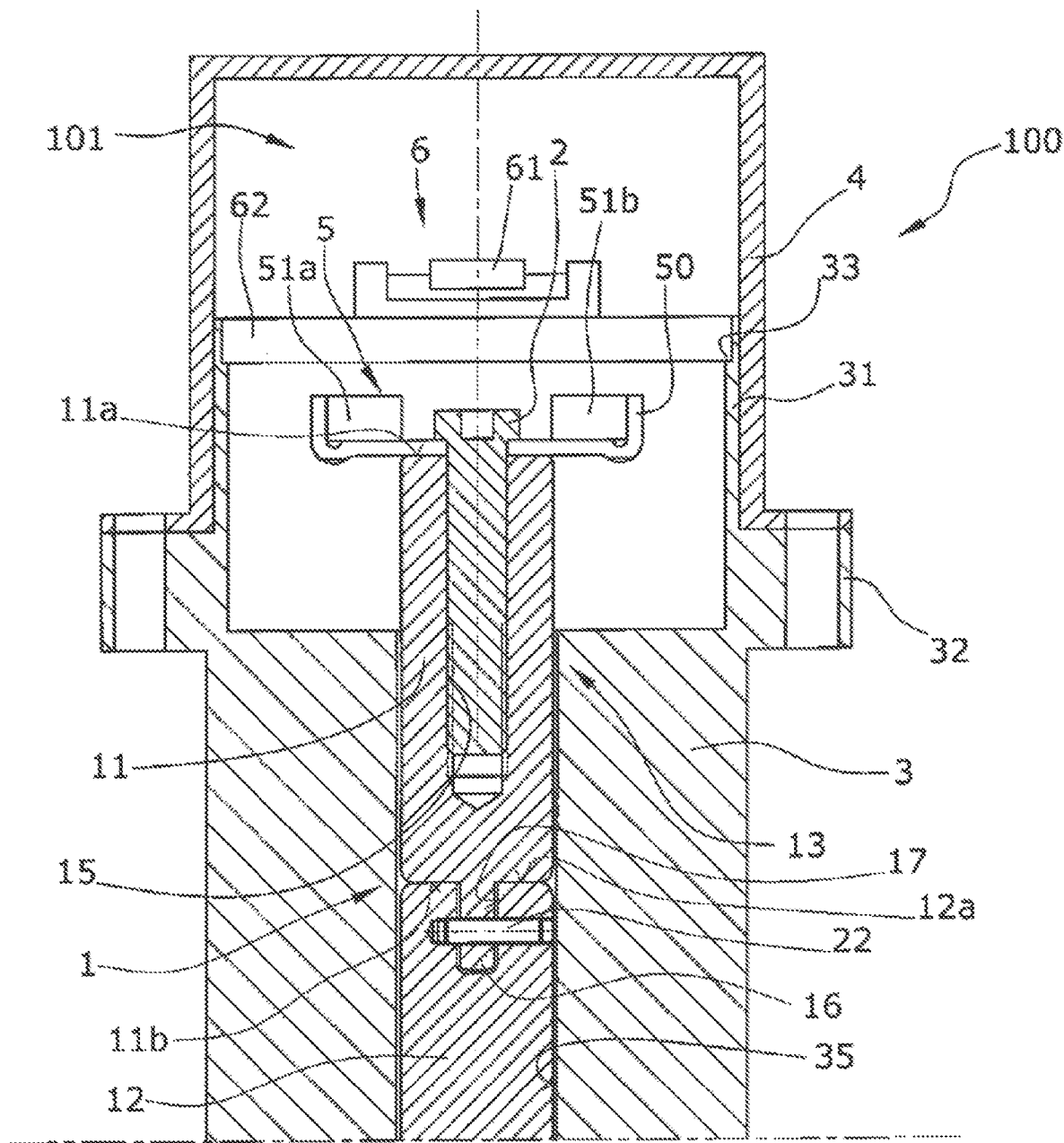
FIG. 3 schematically shows a detail of a second embodiment of an angular displacement measuring system according to the present invention in sectional side view.

FIGS. 1 to 3 respectively show an angular displacement measuring system 100 with a measuring unit 101 adapted to be coupled directly to a drive shaft 1. The measuring unit 101 in particular comprises an exciter unit 5 and a sensor unit 6 and is arranged at a first axial shaft end region 13 of the drive shaft 1. The angular displacement measuring system 100 has substantially the same structure in all illustrated embodiments, the differences between the individual embodiments being in particular in the design of the drive shaft 1.

The drive shaft 1 is typically designed as a solid shaft which can be magnetized at least in part during use. Such magnetizing of the drive shaft 1 may be effected, for example, by an electric motor (not shown in FIGS. 1 to 3) or by a magnetic brake. Devices such as an electric motor are usually arranged in a region of the drive shaft 1 averted from the measuring unit 101, i.e., a second shaft part 12 in the present instance. A shielding of the measuring unit 101 from such magnetic fields is required to avoid possible measuring errors that may be caused by a magnetization of the drive shaft 1. In the present instance, such a shielding is in particular effected by the design of the drive shaft 1, as well as by arranging a shielding body 3 so that undesirable magnetic fields can be deflected effectively from the measuring unit 101.

The shielding body 3 is cylindrical in shape, is stationary, and is made of a magnetically conductive material, for example, of iron or steel. The shielding body 3 encloses the drive shaft 1 at least in a partial region. A defined radial distance is provided between the drive shaft 1 and the shielding body 3 so that the drive shaft 1 is freely rotatable inside the shielding body 3 and a magnetic field transfer from the drive shaft 1 to the shielding body 3 is possible. The shielding body 3 has an inner radial transfer surface 35 surrounding the drive shaft 1 therefor. A magnetic field induced in the drive shaft 1 can thereby be transferred in a relatively simple manner from the drive shaft 1 radially outward into the shielding body 3 and further into a housing 4. The shielding body 3 comprises an inner axial shoulder, as well as a cylindrical section 31 contiguous therewith, which at least partly surrounds an inner space in the radial direction, in which space the exciter unit 5 is arranged. The exciter unit 5 can thereby be shielded from magnetic interferences in a particularly effective manner. A flange 32 is provided on a radial outer side of the shielding body 3 for fastening, via screws 21, the housing 4 to the shielding body 3 and/or for fastening the entire angular displacement measuring system 100 to a machine (not shown). The shielding body 3 can also comprise, as is specifically shown in FIG. 1, an axial bearing section 34 on which a bearing 14 of the drive shaft 1 abuts. This allows for an exact alignment of the measuring unit 101 with respect to the drive shaft 1.

The exciter unit 5 comprises a magnet carrier 50 on which two permanent magnets 51*a*, 51*b* are fastened. The exciter unit 5 is fastened to the drive shaft 1, in particular to a magnetically non-conductive first shaft part 11 of the drive shaft 1, for rotation therewith, using a fastening device 2, i.e., a screw in the present instance. In use, the magnets 51*a*, 51*b* can thereby build a rotational magnetic field corresponding to the rotation of the drive shaft 1 which can be detected by the sensor unit 6. In order to effectively avoid a transmission of a magnetic field to the magnet carrier 50, the screw 2 can, for example, be made of a magnetically non-conductive material.

The sensor unit 6 is stationary and in particular comprises a sensor 61 fastened to the sensor carrier 62, for example, a Hall and/or a Wiegand sensor. The sensor 61 may be suited to detect any rotation of the drive shaft 1. The sensor unit 6 may further comprise processing electronics (not shown). The sensor carrier 62 is designed as a round disc which in the mounted state abuts on a shoulder 33 of the shielding body 3. The sensor carrier 62 thus forms a cover for the exciter unit 5 arranged in the shielding body 3.

A stationary housing 4 surrounds both the shielding body 3 and, at least in part, the measuring unit 101. The housing 4 may be of a cylindrical structure and can be set in a simple manner over a cylindrical section 31 of the shielding body 3 and be fastened to the flange 32 of the shielding body 3 using screws (not shown). The housing 4 can be made of steel so that a magnetic field can be transferred from the shielding body 3 to the housing 4. This allows for a particularly effective magnetic shielding of the measuring unit 101.

FIGS. 1 and 2 show a first embodiment of the present invention in which the drive shaft 1 is formed at least in two parts. The drive shaft 1 is in particular formed by a separately formed first shaft part 11 and a separately formed second shaft part 12, the shaft parts 11, 12 being fixed for rotation with each other.

The first shaft part 11 is arranged in a first axial shaft end region 13 facing the measuring unit 101, is magnetically non-conductive, and is significantly shorter than the second shaft part 12. The second shaft part 12 is arranged in a second shaft end region averted from the measuring unit 101 and may be magnetically conductive. The second shaft part 12 may extend into an electric motor (not shown) or a magnetic brake.

An end face 11b of the first shaft part 11, which is averted from the measuring unit 101, abuts against an end face 12a of the second shaft part 12, which faces the measuring unit 101, the end faces 11a, 11b being fixed to each other by friction welding. The first shaft part 11 and the second shaft part 12 respectively have the same outer diameter and are aligned coaxially with respect to each other so that the two shaft parts 11, 12 make up a complete drive shaft 1 formed substantially without forming an axial shoulder. The drive shaft 1 can thus be mounted in a relatively simple manner.

The first shaft part 11 is designed as a solid shaft in the embodiment shown in the drawings. At the end face 11a facing the measuring unit 101, at which end face 11a the magnet carrier 50 abuts against the first shaft part 11, the first shaft part 11 has a coaxial recess 15 formed by a cylindrical bore in FIG. 1. The bore 15 is provided with a thread for receiving the screw 2. The screw 2 extends through the magnet carrier 50 into the first shaft part 11 of the drive shaft 1 so that the exciter unit 5 is fixed to the drive shaft 1. The screw 2, like the first shaft part 11, is made of a material that is not or is only slightly magnetically conductive. The first shaft part 11 and/or the screw 2 can, for example, comprise a titanium/aluminum/vanadium alloy so that a magnetic field induced in the second shaft part 12 of the drive shaft 1 is not transmitted in the first axial shaft end region 13 of the drive shaft 1 via the first shaft part 11 and/or the screw 2.

In an alternative embodiment of the present invention which is not illustrated, the first shaft part 11 can, for example, be hollow along the axial length thereof, i.e., it is designed as a sleeve. The bore 15 in this case is formed in the end face 12a of the second shaft part 12 facing the first shaft part 11 so that the screw 2 extends through the magnet carrier 50 and the sleeve-shaped first shaft part 11 into the second shaft part 12. A radial distance may be provided between the screw 2 and the sleeve. The outer diameter of the first shaft part 11 can, for example, be smaller than that of the second shaft part 12 to increase stability in this embodiment.

FIG. 3 shows a second embodiment of the present invention which essentially corresponds to the embodiment described with respect to FIGS. 1 and 2, wherein, for an increase in stability, an additional pin connection is provided at the connection point between the first shaft part 11 and the second shaft part 12 of the drive shaft 1. Specifically, the first shaft part 11 has an axially protruding pin 16 on the axial end face 11b facing the second shaft part 12, which pin 16 is inserted into a corresponding recess 17 formed in the second shaft part 12. In FIG. 3, the pin 16 and the recess 17 corresponding thereto are cylindrical in shape and are formed coaxially on the respective shaft part 11, 12. The pin 16 and the recess 17 may alternatively also be shaped differently, for example, angularly, and/or be arranged centrally on the respective end face 11b, 12a. A grub screw 22 is provided in order to secure the first shaft part 11 relative to the second shaft part 12, which grub screw 22 extends radially through at least a part of the second shaft part 12, as well as through the pin 16 of the first shaft part 11. The pin 16 may also be arranged on the second shaft part 12 and a corresponding recess 17 may be arranged in the first shaft part 11.

Figure 4:
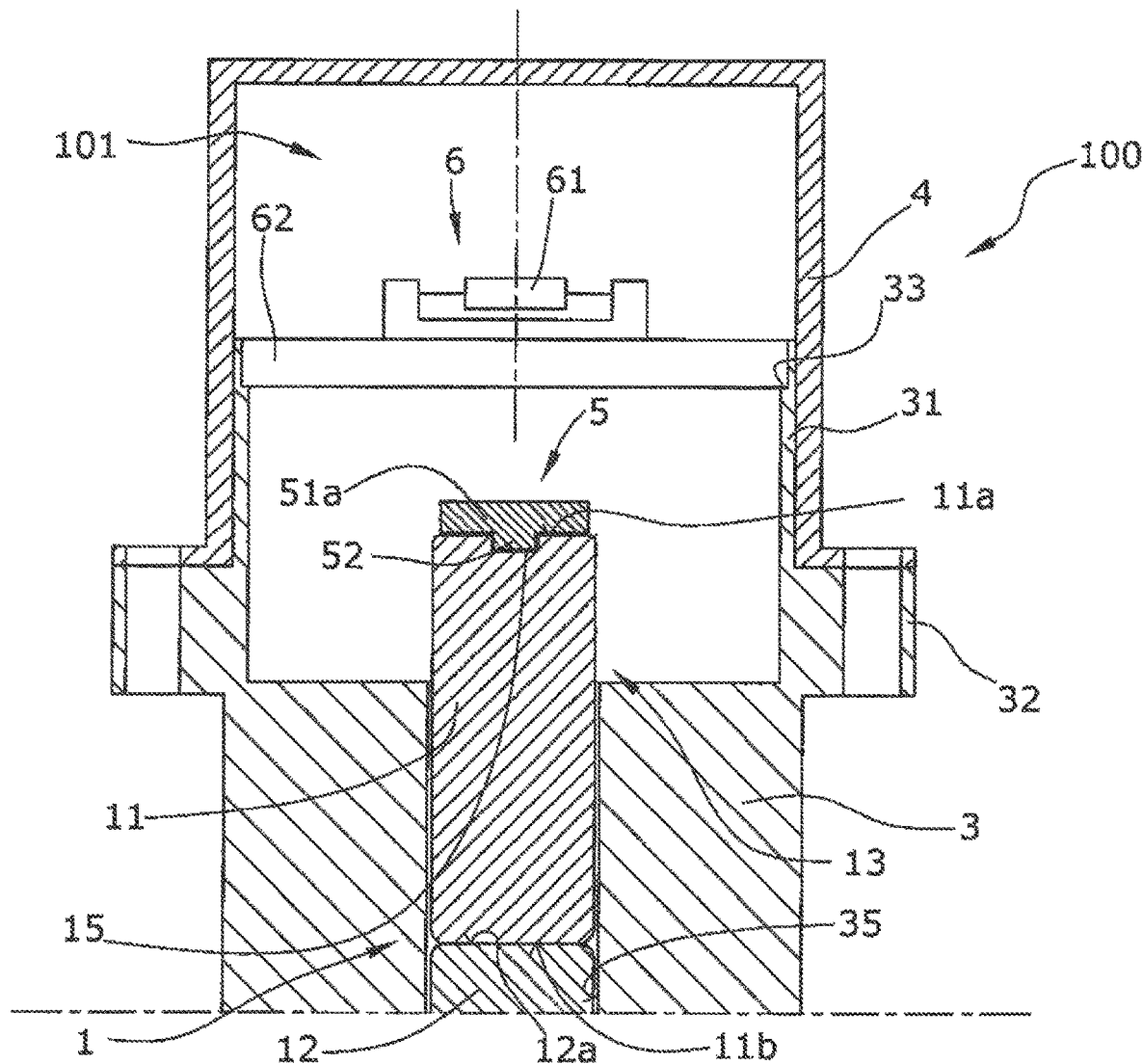
FIG. 4 schematically shows a detail of a third embodiment of an angular displacement measuring system according to the present invention in sectional side view.

FIG. 4 illustrates another embodiment of the present invention which again substantially corresponds to one of the embodiments shown in FIGS. 1 to 3, wherein, in this embodiment, the exciter unit 5 is formed by only one magnet body 51a and is arranged directly at the first axial shaft end region 13 of the drive shaft 1 on the end face 11a facing the measuring unit 101. The magnet body 51a is in particular designed as a diametrically magnetized round magnet and is fastened by adhesive bonding to the drive shaft 1 at an axial end of a first magnetically non-conductive first shaft part 11. An axially protruding magnetic pin 52 of the magnet body 51a is additionally at least partly inserted into a coaxial recess 15 formed in the drive shaft 1 to increase strength. In FIG. 4, the magnetic pin 52 and the coaxial recess 15 corresponding thereto are formed to be cylindrical in shape and coaxial. The magnetic pin 52 and the coaxial recess 15 may alternatively also be shaped differently, for example, angularly, and/or be arranged eccentrically at the magnet body 51a and the drive shaft 1. It thereby becomes possible to in particular protect the magnet body 51a against relative rotation with respect to the drive shaft 1. The entire magnet body 51a, for example, designed as a diametrically magnetized round magnet, can alternatively be set axially into a corresponding coaxial recess 15. The axially protruding magnetic pin 52 may be omitted in this case. One may in particular omit a separately formed magnet carrier 50 and a screw for fastening the magnet body 51a to the drive shaft 1 in the embodiments of the present invention shown in and/or described with reference to FIG. 4.

The angular displacement measuring system 100 therefore provides for an exact and interference-free measuring, a relatively simple and compact structure, and for an uncomplicated assembly.

The present invention is not limited to embodiments described herein; reference should be had to the appended claims.

REFERENCE NUMERALS 100 angular displacement measuring system
101 measuring unit
1 drive shaft
11 first shaft part
11a end face
11b end face
12 second shaft part
12a end face
13 first shaft end region
14 bearing
15 coaxial recess/bore
16 pin
17 recess
2 fastening device/screw
21 screw
22 screw
3 shielding body
31 cylindrical section
32 flange
33 shoulder
34 bearing section
35 inner radial transfer surface
4 housing
5 exciter unit
50 magnet carrier
51a permanent magnet/magnet/magnet body
51b permanent magnet/magnet
52 magnetic pin
6 sensor unit
61 sensor
62 sensor carrier

What is claimed is:

1. A magnet-based angular displacement measuring system for detecting a rotational movement of a driveshaft, the magnet-based angular displacement measuring system comprising:
   the driveshaft comprising an axial first shaft end region, the axial first shaft end region comprising a magnetically non-conductive material;
   an exciter unit rotationally coupled to the axial first shaft end region of the driveshaft; and
   a stationary sensor unit configured to functionally cooperate with the exciter unit to detect a rotational movement of the driveshaft,
   wherein,
   the driveshaft comprises a two-part structure comprising a first shaft part and a second shaft part,
   the first shaft part and the second shaft part are each formed separately, and
   the axial first shaft end region is formed by the first shaft part.

2. The magnet-based angular displacement measuring system as recited in claim 1, wherein the first shaft part and the second shaft part are configured to at least in part radially overlap each other.

3. The magnet-based angular displacement measuring system as recited in claim 1, wherein the first shaft part and the second shaft part are connected to each other for a common rotation.

4. The magnet-based angular displacement measuring system as recited in claim 1, wherein the axial first shaft end region is formed by a fasting device.

5. The magnet-based angular displacement measuring system as recited in claim 1, further comprising:
   a shielding body comprising a cylindrical section which is configured to radially surround the driveshaft in at least an axial section,
   wherein,
   an air gap is formed between the shielding body and the driveshaft.

6. The magnet-based angular displacement measuring system as recited in claim 5, wherein,
   the shielding body further comprises an axial bearing section,
   the driveshaft further comprises a bearing, and
   the bearing of the driveshaft is configured to abut on the axial bearing section (34) of the shielding body.

7. The magnet-based angular displacement measuring system as recited in claim 5, further comprising:
   a sensor unit; and
   a housing,
   wherein,
   the shielding body further comprises at least one shoulder on which at least one of the sensor unit and the housing are fixed.

8. The magnet-based angular displacement measuring system as recited in claim 5, further comprising:
   a housing configured to at least partly surround the angular displacement measuring system.

9. The magnet-based angular displacement measuring system as recited in claim 8, wherein the housing is configured to be set axially on the shielding body.

10. The magnet-based angular displacement measuring system as recited in claim 1, wherein the exciter unit comprises a magnet carrier which comprises at least one magnet fixed thereon.

11. The magnet-based angular displacement measuring system as recited in claim 1, wherein the exciter unit is formed by a magnet.

12. The magnet-based angular displacement measuring system as recited in claim 1, wherein the exciter unit is fastened on the axial first shaft end region of the driveshaft via an adhesive bonding.

13. The magnet-based angular displacement measuring system as recited in claim 1, wherein the driveshaft further comprises a recess in the axial first shaft end region which is configured so that the exciter unit is insertable therein at least in part.

14. The magnet-based angular displacement measuring system as recited in claim 1, further comprising:
   a fastening device configured to couple the exciter unit to the first shaft part of the driveshaft.

15. The magnet-based angular displacement measuring system as recited in claim 14, wherein the fastening device is a screw which is magnetically non-conductive.

* * * * *